United States Patent [19]

Hsu

[11] Patent Number: 4,519,126
[45] Date of Patent: May 28, 1985

[54] METHOD OF FABRICATING HIGH SPEED CMOS DEVICES

[75] Inventor: Sheng T. Hsu, West Windsor Township, Mercer County, N.J.

[73] Assignee: RCA Corporation, Princeton, N.J.

[21] Appl. No.: 560,459

[22] Filed: Dec. 12, 1983

[51] Int. Cl.³ .......................................... H01L 21/283
[52] U.S. Cl. ..................... 29/571; 29/577 C; 29/590; 29/591; 156/653; 357/42; 357/67
[58] Field of Search ............... 29/571, 576 R, 578, 29/590, 577 C, 591; 357/61, 67 S, 42; 427/88; 156/653

[56] References Cited

U.S. PATENT DOCUMENTS

| | | | |
|---|---|---|---|
| 4,102,733 | 7/1978 | De La Moneda et al. | 156/653 |
| 4,216,573 | 8/1980 | Joshi et al. | 29/571 |
| 4,305,200 | 12/1981 | Fu et al. | 29/571 |
| 4,333,099 | 6/1982 | Tanguay et al. | 357/67 |
| 4,374,700 | 2/1983 | Scott et al. | 156/656 |
| 4,392,299 | 7/1983 | Shaw | 29/590 |
| 4,443,930 | 4/1984 | Hwang et al. | 29/571 |

OTHER PUBLICATIONS

"Beam-Lead Technology", M. P. Lepselter, *The Bell System Tech. Journal*, vol. XLV, No. 2, Feb. 1966, pp. 233-253.

"Reducing the Sheet Resistance . . . ", V. L. Rideout, *IBM Technical Disclosure Bulletin*, vol. 17, No. 6, Nov. 1974, pp. 1831-1833.

"SB-IGFET: An Insulated Gate . . . Source and Drain", M. P. Lepselter et al., *Proc. IEEE-Letters*, Aug. 1968, pp. 1400-1402.

*Primary Examiner*—Aaron Weisstuch
*Attorney, Agent, or Firm*—Birgit E. Morris; Donald S. Cohen; Lawrence P. Benjamin

[57] ABSTRACT

In order to reduce the mechanical stress that occurs at the interface of a layer of a refractory metal silicide and a layer of silicon dioxide, it is proposed that a buffer layer of polycrystalline silicon be interposed between the two layers. To accomplish this and prior to forming contact openings, the buffer layer of polycrystalline silicon is deposited on the layer of silicon dioxide and the structure is then provided with an apertured mask to define the contact openings. The structure is then initially etched through both the buffer layer and the underlying layer of silicon dioxide in order to expose portions of the buried contact regions followed by a second etch of only the buffer layer to only expose portions of the layer of silicon dioxide in order to form a gate member and any required interconnects. The process further includes the formation of a layer of metal silicide on the interconnects, in the contact openings and on the gate member.

5 Claims, 4 Drawing Figures

METHOD OF FABRICATING HIGH SPEED CMOS DEVICES

BACKGROUND OF THE INVENTION

This invention relates, in general, to semiconductor devices and, more particularly, to an improved method of fabricating CMOS semiconductor devices.

The factors that have the greatest impact on the probe yield of integrated circuits are directly related to the physical size or dimensions of the chip being manufactured and to the packing density or, the number of devices that are formed within a given chip area. As the requirement for higher speeds increases, the device active area is scaled down, introducing other difficulties which had not heretofore appeared. Accordingly, the process described by M. P. Lepselter entitled "BEAM LEAD TECHNOLOGY", *Bell System Journal*, Vol. XLV, No. 2, February 1966 would be entirely unsatisfactory for the present high speed, high packing density art. The process described in the article is directed to fabricating beam-lead devices wherein the leads serve both a structural and electrical function and is directed to the formation of a platinum silicide ohmic contact and the subsequent formation of a lead consisting of a tri-layer of sputtered titanium, platinum, and electroformed gold.

Similarly, in a recent patent to D. J. Tanguay et al. entitled "USE OF SILICIDE TO BRIDGE UNWANTED POLYCRYSTALLINE SILICONE P-N JUNCTION", which issued on June 1, 1982 as U.S. Pat. No. 4,333,099 and assigned to the same assignee as the subject application the authors chose to address the problem arising in CMOS devices where polycrystalline silicon (polysilicon) lines are utilized to interconnect various elements. However, when using polysilicon, unwanted PN junctions were allowed to be formed after which they were electrically short circuited by a section of silicide which bridged the unwanted formations. It is well known, however, that buried contact processes are able to increase packing density still further without sacrificing the performance of, for example, NMOS integrated circuits. Although the buried contact concept also appears in complementary-metal-oxide-semiconductor (CMOS) devices, the diode formed between the P+ diffusion and the N+ polysilicon or between the P+ polysilicon and N+ polysilicon has been said to have an appreciable effect on the speed of the CMOS circuit.

Accordingly, as an alternative to the prior art processes it would be highly desirable to be able to fabricate a buried contact capable of functioning with CMOS devices without the resultant requirement to short circuit or otherwise remove the buried contact diode. It is also imperative for the success of any such device that the fabrication complexity not be increased and that the speed of the device is increased.

SUMMARY OF THE INVENTION

In accordance with the invention herein described, I will describe a method for forming buried contacts and interconnects utilizing a refractory metal silicide. However, since it is well known that a large mechanical stress is formed at the interface of a layer of refractory metal silicide and its underlying layer of silicon dioxide which could eventually lead to a short circuit to the substrate, through the silicon dioxide insulation layer, it is proposed that a buffer layer be used between the two layers to eliminate this mechanical stress.

BRIEF DESCRIPTION OF THE INVENTION

FIGS. 1-4 are illustrative of the various stages in the processing of a semiconductor device utilizing the teachings of my invention.

DETAILED DESCRIPTION OF THE PREFERRED EMBODIMENT

Figure 1:
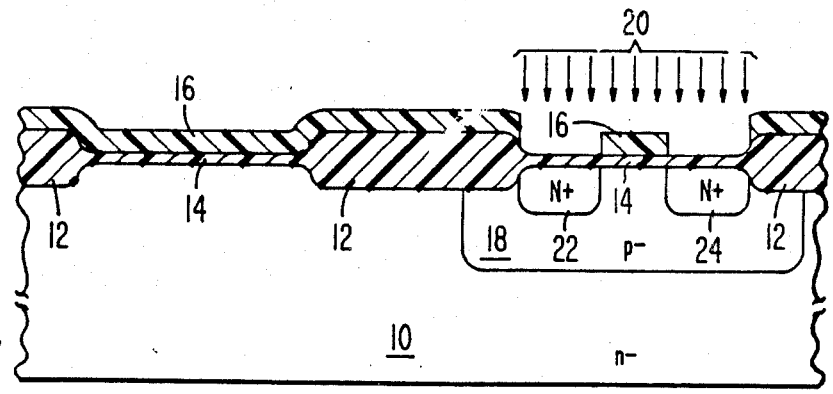

Referring now to FIG. 1 there is shown a portion of a monocrystalline silicon wafer 10, in cross section, that has been partially processed. For example, wafer 10 has been provided with field oxide portions 12, a pair of oxide portions 14 and a p well 18, all having been formed at the surface of wafer 10 in a usual or well known manner. Field oxide portions 12 may have been formed by masking the substrate over areas 14 with a silicon nitride layer (not shown) and thereafter oxidizing the exposed portions. As shown in FIG. 1 a portion of the wafer is masked with an apertured layer 16 of photoresist. Using selective implantation, the source and drain regions 22 and 24 are implanted with, for example, phosphorus as indicated symbolically by arrows 20.

Figure 2:
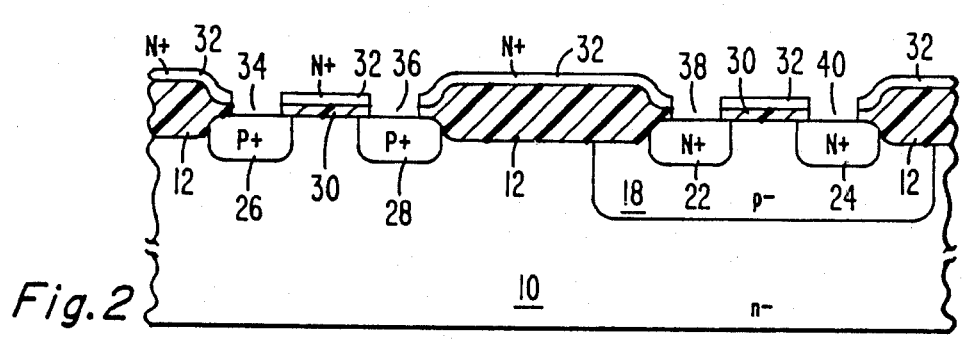

Thereafter, masking layer 16 is removed or stripped and, the previously masked portion is now provided with a similar apertured photoresist mask and implanted with, for example, boron atoms to form source 26 and drain 28 as shown in FIG. 2. Thereafter, oxide portions 14 are removed and a layer of gate oxide 30 is grown by the thermal oxidation of the exposed portions of silicon substrate 10. After the formation of gate oxide 30, a buffer layer 32 of doped polycrystalline silicon (polysilicon) is formed over the entire surface of the device. The surface of buffer layer 32 is then provided with an appropriate mask, after which the device is subjected to a plasma etching step to form contact openings 34, 36, 38, and 40.

Figure 3:
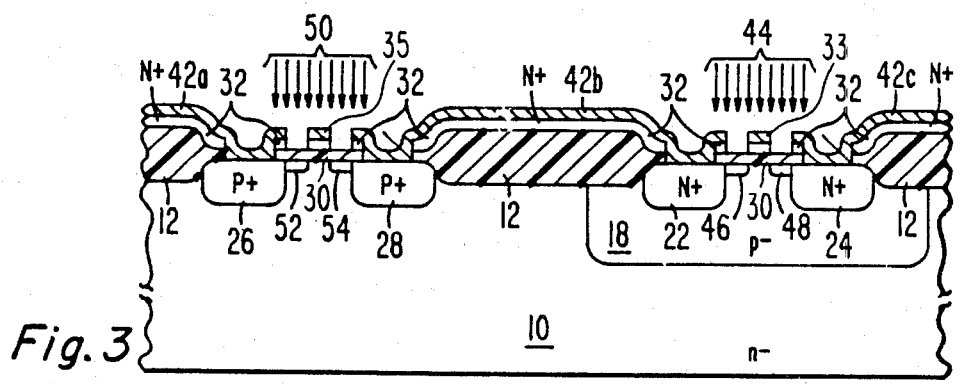

As shown in FIG. 3, the entire polysilicon buffer layer 32 surface and all the exposed areas of substrate 10 are then provided with a layer of a metal silicide. This may be done by any number of processes familiar to the art. For example, one may use one of the prior art processes in which a refractory metal layer is deposited on a previously formed layer of silicon and heated to form the silicided layer. The difficulties encountered with such a process comes about when, for example, after the heat treatment the user is left with either an excess of the refractory metal or an excess of the silicon. Any excess of refractory metal must be removed within a short period of time to prevent the formation of an undesirable refractory metal oxide. However, attention is directed to U.S. Pat. No. 4,392,299 entitled "METHOD OF MANUFACTURING LOW RESISTANCE GATES AND INTERCONNECTIONS", which issued to J. M. Shaw on July 12, 1983, and which is assigned to the same assignee as the subject application. In this latter patent, a method is disclosed wherein a refractory metal and silicon are simultaneously co-deposited to form a composite layer. After heating in a non-oxidizing atmosphere, the polycrystalline state of the silicide is formed. This satisfies all the requirements necessary in that after having provided polysilicon buffer layer 32, it is not now consumed in the Shaw siliciding process.

Thus, after having formed the layer of silicide on top of buffer layer 32, the top surface of this layer of silicide is now provided with an apertured mask (not shown) and apertures etched therein to form gate members 33 and 35. This may be done either by a chemical or by a plasma etching technique. The next step is an implantation process as shown symbolically by arrows 44 in which source extension 46 and drain extension 48 are formed. Thereafter, the mask is removed and reapplied to shield the newly formed N channel device and, with appropriate apertures positioned above the P channel device, will, when implanted with boron, for example, as indicated by arrows 50, form source extension 52 adjacent source contacts 26 and drain extension 54 which is in contact with drain contact 28. Having described the process for forming the described structure, it now becomes obvious that silicide portion 42a provides a good ohmic contact to source region 26 of the P channel device while silicide portion 42c is in a similar ohmic contact with drain contact 24 of the N channel device. To complete the CMOS device, interconnection 42b provides the ohmic contacts with both the drain region 28 of the P channel device and the source region 22 of the N channel device.

While in the above example I have shown that source and drain extensions 46, 48, 52, and 54 were formed after the silicide layer is formed, it should now be obvious that the implanted extensions may be formed prior to the deposition of the silicide layer. In any event, the two masking steps will have to be accomplished in order to prevent the P type conductivity modifiers from being implanted into the N channel devices and to prevent N type conductivity modifiers from being implanted into P channel devices.

Figure 4:
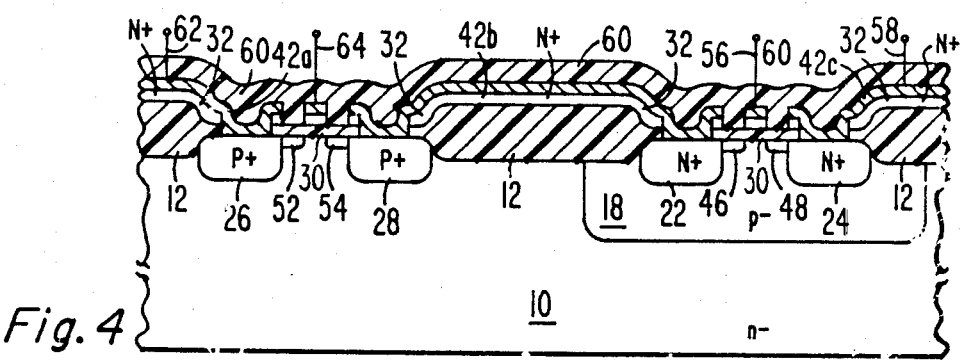

Thereafter, as shown in FIG. 4, the device is provided with the appropriate passivating layer 60 which may be an undoped glass layer or a glass layer doped with boron (a borosilicate glass), or phosphorous (a phosphosilicate glass), or a BPSG layer which is a borophosphosilicate glass. As is well known in the art, connections may be made from contact 42a to a P channel source pad contact at the perimeter of the chip and is herein shown schematically as pad 62. Similarly, the gate member of the P channel device may be brought out to a pad and is shown schematically herein as 64. Similarly, the gate of the N channel device and the source of the N channel device may be brought out to pads and are herein shown schematically as pads 56 and 58.

Thus, by utilizing the method described above, I am able to avoid the prior art difficulties by producing a low resistance buried contact and interconnection without the prior art objectionable diode and without sacrificing the speed of operation or having to resort to an excessively large device.

What I claim is:

1. A process for fabricating integrated circuits each having buried drain and source contact regions of a first conductivity type at the surface of a body of monocrystalline silicon of a second conductivity type, the surface having a layer of insulator material thereon, comprising the sequential steps of:

depositing a buffer layer of polycrystalline silicon over the layer of insulator material;

etching contact openings in both the layer of polycrystalline silicon and in the layer of insulator material thereunder to expose portions of the buried contact regions;

further etching only the layer of polycrystalline silicon to expose portions of the layer of insulator material to form gate members and interconnect portions; and forming a layer of refractory metal silicide on the interconnect portions of the polycrystalline silicon layer, in the contact openings and on the gate member.

2. The process of claim 1 wherein the layer of insulator is formed by the steps of:

forming relatively thick portions of field oxide on selected portions of the surface of the layer of monocrystalline silicon;

thermally growing a relatively thin layer of gate oxide on the remaining portions of the surface of the monocrystalline silicon.

3. The process of claim 2 comprising the further steps of:

etching through the buffer layer to expose portions of the layer of gate oxide;

doping the body through the exposed portions of gate oxide, to form drain and source extensions adjacent respective contact regions under the gate oxide layer.

4. The process of claim 3 wherein the drain and source extensions are formed prior to the formation of the layer of refractory metal silicide.

5. The process of claim 4 comprising the further step of:

forming a layer of passivating glass over the entire surface of the structure.

* * * * *